United States Patent
Jeong

[19]

[11] Patent Number: 6,147,536
[45] Date of Patent: Nov. 14, 2000

[54] DELAY CIRCUIT FOR DELAYING A HIGH FREQUENCY SIGNAL AND CAPABLE OF ADJUSTING AN EFFECTIVE PULSE WIDTH

[75] Inventor: Bong-Hwa Jeong, Seoul, Rep. of Korea

[73] Assignee: Hyundai Electronics Industries Co., Kyoungki-do, Rep. of Korea

[21] Appl. No.: 09/188,188

[22] Filed: Nov. 10, 1998

[30] Foreign Application Priority Data

Apr. 24, 1998 [KR] Rep. of Korea ....................... 98-14719

[51] Int. Cl.[7] .................................................. H03H 11/26
[52] U.S. Cl. .......................... 327/283; 263/264; 263/268; 263/284; 263/172
[58] Field of Search ................................. 327/263, 264, 327/268, 284, 172

[56] References Cited

U.S. PATENT DOCUMENTS

5,319,607  6/1994  Fujii et al. .
5,434,523  7/1995  Sundstrom ............................... 327/172
5,929,681  7/1999  Suzuki ..................................... 327/284

*Primary Examiner*—Margaret R. Wambach
*Assistant Examiner*—Cassandra Cox

[57] ABSTRACT

A delay circuit is disclosed which includes first level transition unit for receiving an input signal having more than two different logic levels and varying the pulse width of the signal, and second level transition unit connected with the first level transition unit for varying a pulse width of a signal inputted, whereby the delay circuit delays an output signal from the second level transition unit, wherein said first and second level transition unit includes an inverting unit for inverting an input signal, a MOS transistor having its gate electrode receiving the input signal and its first and second electrodes receiving an output signal from the inverting unit, a resistor connected between the first electrode and the second electrode, and a capacitor connected between the second electrode and a ground.

18 Claims, 6 Drawing Sheets

DELAY CIRCUIT FOR DELAYING A HIGH FREQUENCY SIGNAL AND CAPABLE OF ADJUSTING AN EFFECTIVE PULSE WIDTH

BACKGROUND OF THE INVENTION

1. Field of the Invention

The present invention relates to a delay circuit, and in particular to an improved delay circuit which is capable of controlling an effective pulse width of a signal and implementing a proper delay time for a signal having a shorter pulse.

2. Description of the Background Art

Generally, for implementing predetermined functions using a plurality of semiconductor devices, a semiconductor circuit is designed to have a proper delay time of a corresponding signal for a synchronization between signals of the circuit. For example, in a dynamic random access memory, a predetermined delay time of an address signal is implemented to ensure address transition detection.

Figure 1:
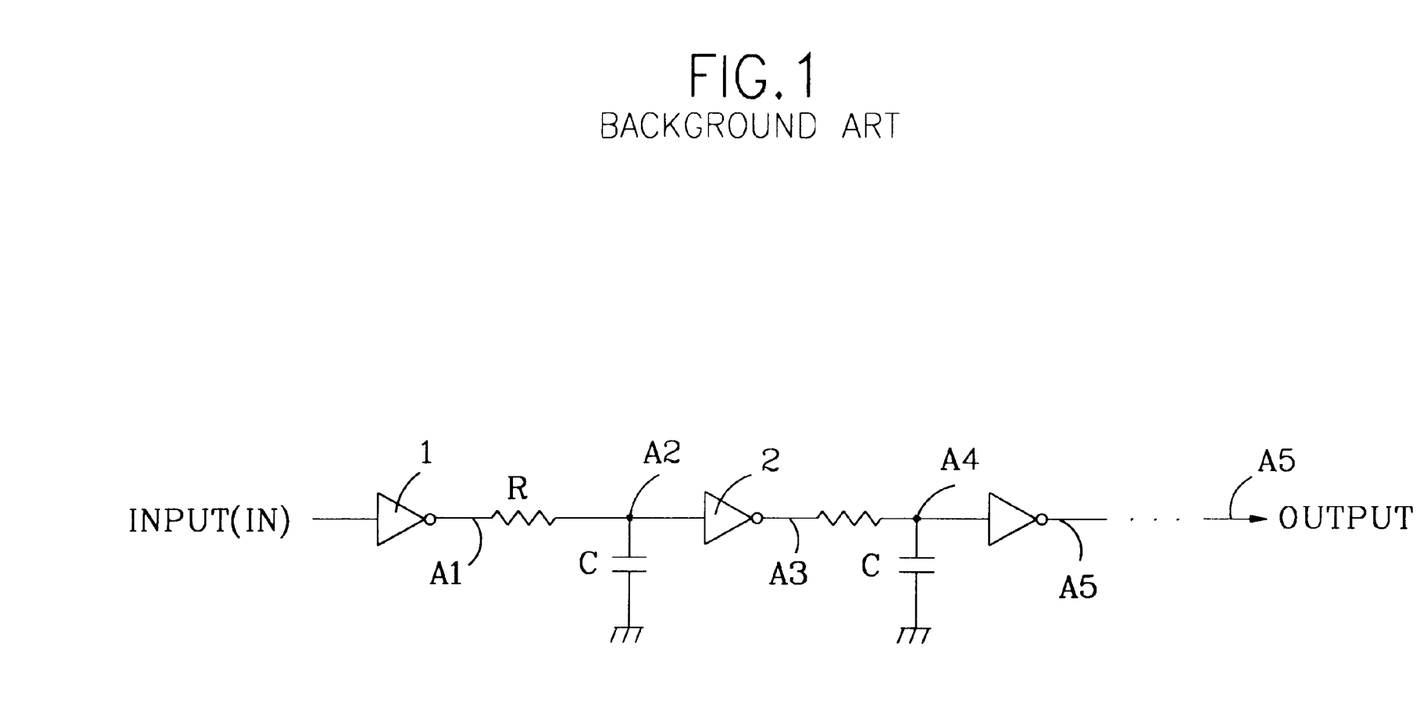
FIG. 1 is a circuit diagram illustrating the construction of a known delay circuit.

As shown in FIG. 1, the known delay circuit includes first and second inverters 1 and 2 as an inverting unit and a resistor R and a capacitor C connected between the first and second inverters 1 and 2. The delay time is determined by a logic threshold voltage of an inverter, a resistance component and a capacitance component of the capacitor.

Figure 2A:
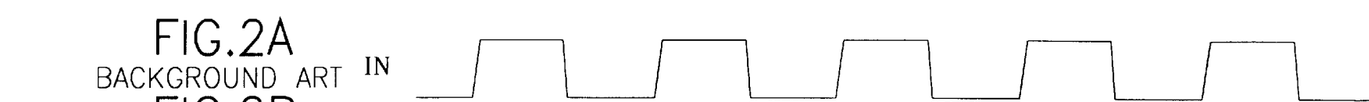
FIGS. 2A through 2F are wave form diagrams illustrating signals from each element of the circuit of FIG. 1.
Figures 2B, 2C:
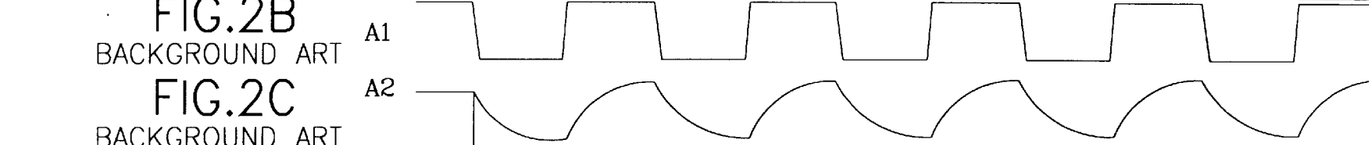
Figure 2D:
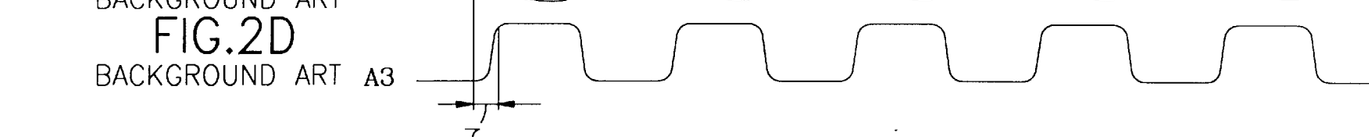
Figure 2E:
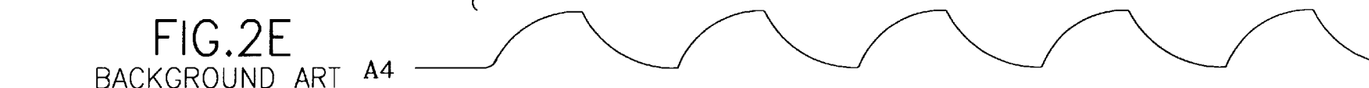

The signal wave forms at each node are shown in FIGS. 2A through 2F. FIG. 2A illustrates an input signal IN, FIG. 2B illustrates a signal inverted by the first inverter 1, FIG. 2C illustrates a signal of the resistor R and the capacitor C, and FIG. 2D illustrates a signal inverted by the second inverter 2. The input signal IN is delayed by the delay amount of T as shown in FIG. 2D.

Figure 2F:
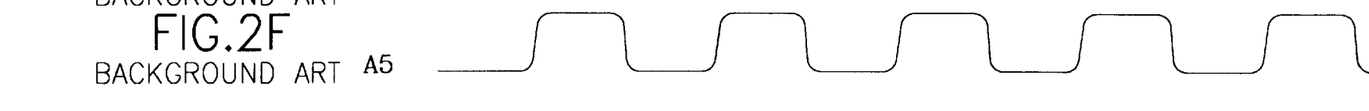

The signal waveform at the node A1 has a smoothly dropping curve by the resistor R and the capacitor C, and a PMOS transistor (not shown) constituting the second inverter 2 is operated at the point where the signal is delayed by the threshold voltage of the PMOS transistor. The cascaded delay circuits provide a signal (A5; FIG. 2F) having a predetermined delay time with respect to the input signal.

In the semiconductor circuit, when implementing a high speed signal process, the higher frequency of an input signal makes the pulse width narrower. In the above state, when delaying the signal much longer, the delay circuit as shown in FIG. 1 may be used. Since the delay circuit provides a lengthy delay time, if the width of the input pulse is shorter, the distortion is increased, so that the level of the input signal may be changed prior to the delay, and the signal itself may disappear. Namely, during the time over which one pulse is inputted, the next pulse is inputted, so that the pulse loss occurs.

In order to overcome the above problems, a plurality of delay circuits each providing a short delay time may be used for outputting a signal having a predetermined delay time.

Figure 3:
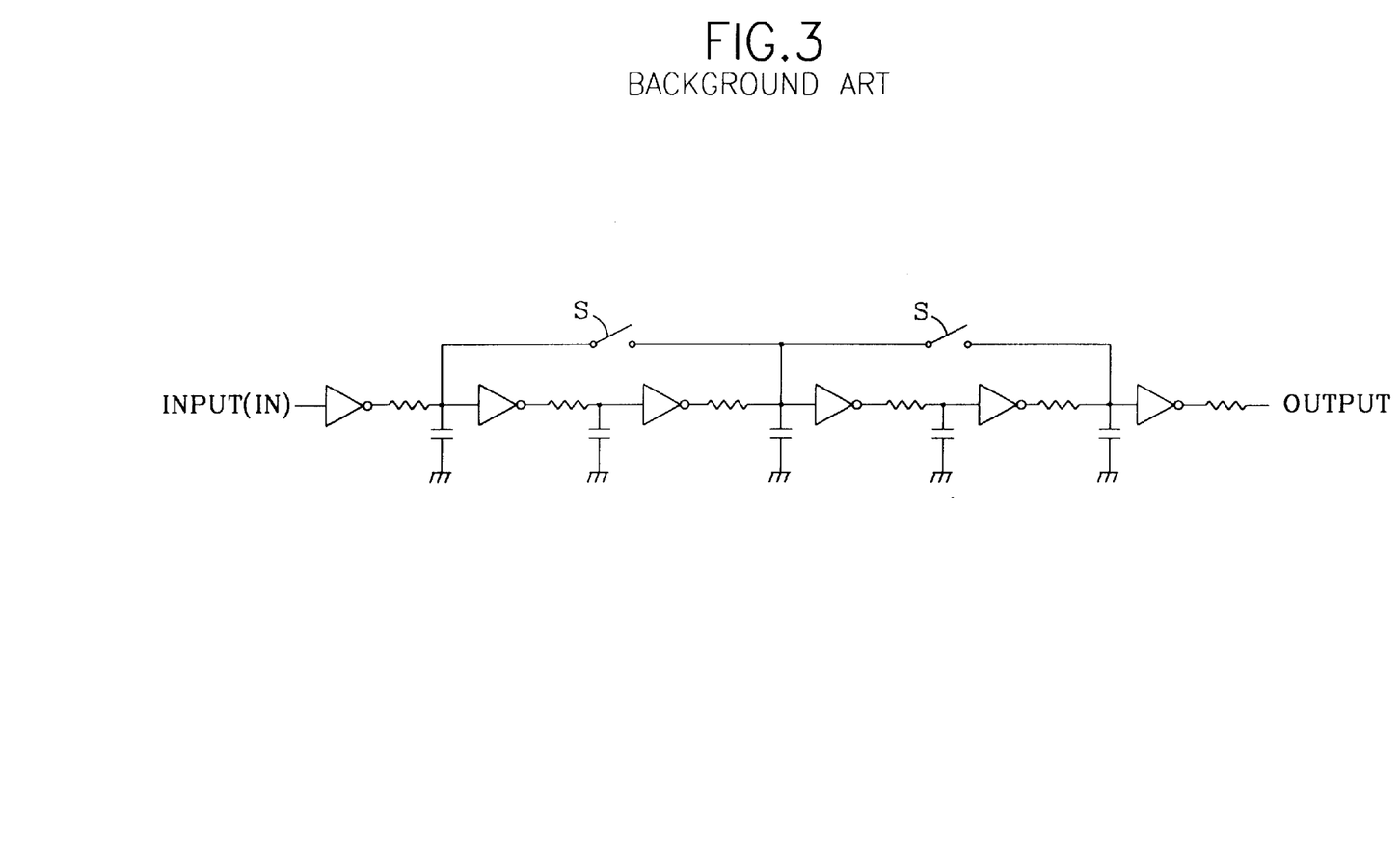
FIG. 3 is a circuit diagram illustrating the construction of a known delay circuit having a function for finely controlling a delay time.

For implementing a fine adjustment of the delay, a switching unit S is adapted to each delay circuit as shown in FIG. 3. Namely, in order to implement the fine delay time, a plurality of delay circuits which are capable of providing a short delay time are connected in multiple stages, so that the delay time is obtained based on the option with respect to the on/off setting of the switching unit S.

However, the above-described construction has the following drawbacks. Since the entire current of the circuit is the summed current which is generated by the operation of each inverter, so that the number of stages is proportional to the current consumption. Therefore, the current consumption is increased. Furthermore, when physically implementing the above circuit, the layout area of the circuit is increased. When the CMOS circuit is used, since the bulk of the NMOS transistor and the PMOS transistor applied on the semiconductor substrate is different, a larger occupied area relative to other devices is required.

In the known delay circuit, the rising time and falling time of the signal are similar thereby causing a different active width. Namely, when the signal is activated to a high level, the effective pulse width (until the pulse signal becomes a low level) is different from the pulse width of the inputted signal. This causes the effective pulse width to be different, resulting in a varied duty ratio.

In order to overcome the problem that the duty ratio is varied, the inverted signal may be used instead of using an activation with a logic high level, and then the signal may be delayed. To this end, the PMOS device and NMOS device are required to be used as a CMOS inverter for a duty ratio adjustment.

Therefore, the semiconductor devices are additionally used for increasing the device mounting area, so that it is difficult to implement a highly integrated device. When a fine adjustment is required for a delay time selection, more layout area is required.

As the dynamic random access memory device is highly integrated, and the operational speed of the same is increased, the delay circuit is used as an important element for eliminating a skew between a clock and a signal and implementing an accurate timing. Namely, the input signal should be transmitted to a predetermined element without error, and the duty ratio should be accurately adjusted.

SUMMARY OF THE INVENTION

It is an object of the present invention to provide a delay circuit which is capable of outputting an output signal having a predetermined delay time with respect to a shorter pulse interval in a highly integrated and high speed semiconductor device, thereby decreasing a layout area of the circuit.

It is another object of the present invention to provide a delay circuit which is capable of adjusting an active pulse width with respect to a signal of a highly integrated and high speed semiconductor device.

It is another object of the present invention to provide a delay circuit which is capable of selectively adjusting a rising time and a falling time of a signal for thereby implementing a predetermined active pulse width and adjusting a rising time and a falling time even when the width of the pulse signal is varied during an operation of the circuit.

To achieve the above objects, there is provided a delay circuit, comprising: first level transition means for receiving an input signal having more than two different logic levels and varying the pulse width of the signal; second level transition means connected with the first level transition means for varying a pulse width of a signal inputted; and a delay unit which delays an output signal from the second level transition means, said first and second level transition means includes: an inverting means for inverting a signal input to the inverting means; a MOS transistor having its gate electrode receiving the input signal and its first and second electrodes receiving an output signal from the inverting means; a resistor connected between the first electrode and the second electrode; and a capacitor connected between the second electrode and a ground.

To achieve the above objects, there is further provided A delay circuit, comprising: a first level transition means for receiving an input signal having two different logic levels and varying a pulse width of the same; a second level transition means connected with the first level transition means for varying a signal output from the first level transition means; a delay unit for delaying an output signal from the second level transition means; a duty detection means having a logic combining circuit for logically combining signals input to the first and second level transition means and an output signal from the duty detection means as an output signal for activating and non-activating the first and second level transition means, each of the first and second level transition means includes: an inverting means for inverting a signal input to the inverting means; a MOS transistor having a gate electrode for receiving the signal input to the inverting means and first and second electrodes for receiving an output signal from the inverting means; a resistor connected between the first electrode and the second electrode; and a capacitor connected between the second electrode and a ground.

In the present invention, the delay circuit includes a duty detector for outputting different signals based on the duty ratio of the output signal from the delay circuit and a unit for activating or non-activating a level transition unit in response to different signals.

Additional advantages, objects and features of the invention will become more apparent from the description which follows.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

In the present invention, there is provided a delay circuit capable of obtaining a delayed signal by providing a delay to an input signal having a high frequency and controlling a rising time and falling time of a signal and an effective pulse width.

In the known delay circuit, a rising time and falling time are similar and not easily controlled. Therefore, the delay circuit is designed to have different delay time for a high level signal receiving side and a low level signal receiving side for controlling an effective pulse width. Here, the effective pulse width represents an interval in which a pulse signal is a high level when a high level signal is used as an activated signal. If a low level signal is used as an activated signal, the effective pulse width represents a low pulse signal interval.

In the present invention, the rising time and falling time are selectively decreased for thereby implementing an effective pulse width having a predetermined width, even when the pulse width is varied during operation, the rising and falling time may be controlled.

Figure 4:
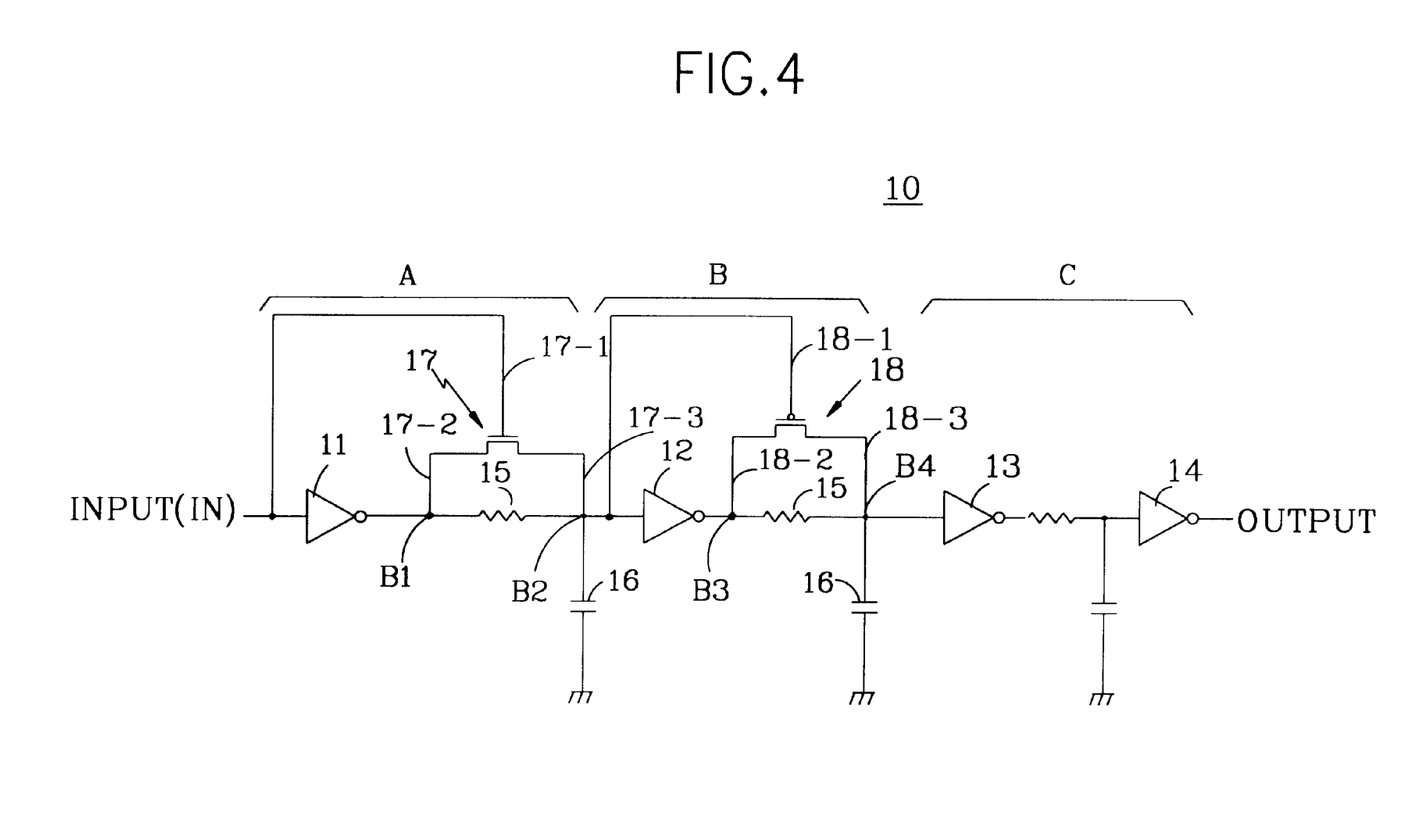
FIG. 4 is a circuit diagram illustrating the construction of a delay circuit according to the present invention.

FIG. 4 illustrates a principle of the present invention. In the drawings, reference numeral 10 generally denotes a delay circuit according to the present invention.

The delay circuit 10 includes a first level transition unit A, a second level transition unit B, and a delay unit C. In a preferred embodiment of the present invention, the delay circuit 10 according to the present invention may include at least a level transition unit consisting of: an inverting unit 11 for receiving an input signal IN having two different logic levels, a MOS transistor 17 having a gate electrode 17-1 receiving the input signal IN and a first electrode 17-2 and a second electrode 17-3 connected with an output terminal of the inverting unit 11, a resistor connected is between the first and second electrode of the MOS transistor 17, and a capacitor connected between the second electrode and a ground. Preferably, a level transition unit and inverting unit 13 and 14, a resistor R and a capacitor C may be further included. The present invention essentially includes a level transition unit. Various delay circuits using such a level transition unit may be provided as various modified embodiments of the present invention.

FIGS. 5A through 5F illustrate signal wave forms of signals of each element of FIG. 4. The delay circuit 10 including a level transition circuit according to the present invention will be explained.

Figures 5A, 5B:
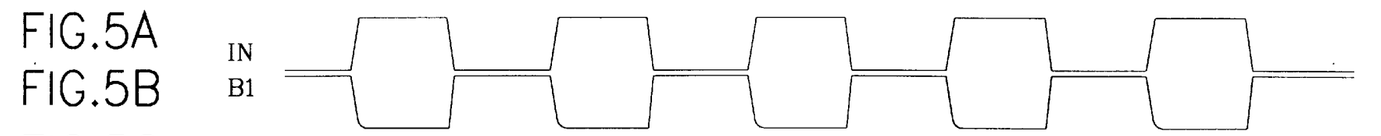
FIGS. 5A through 5F are wave form diagrams illustrating signals from each element of the circuit of FIG. 4.
Figures 5C, 5D, 5E:
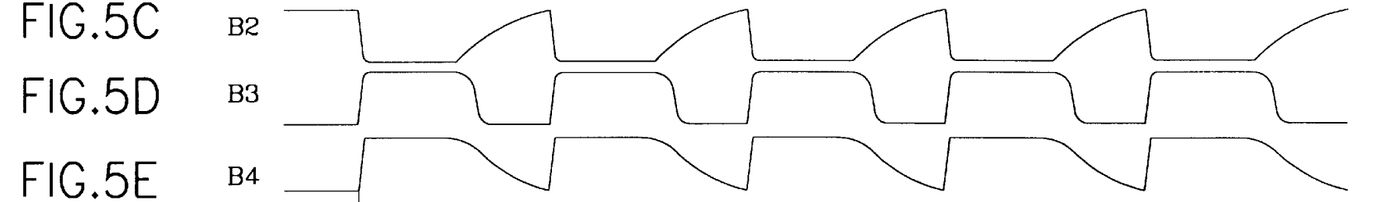
Figure 5F:
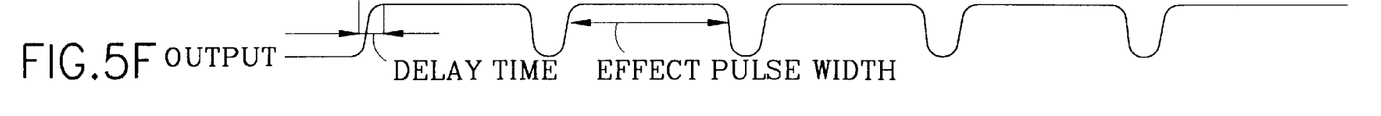

When a signal having a level varying from a low level to a high level is inputted into a first level transition unit A as shown in FIG. 5A, the output signal B1 as shown in FIG. 5B becomes a low level by an inverting unit 11. At this time, the NMOS transistor 17 receiving an input signal IN through the gate 17-1 is turned on in response thereto. Since the input signal IN is directly transmitted without being transmitted to a resistor 15 connected between a first electrode 17-2 and a second electrode 17-3 or a drain and source, there is not a delay time. Therefore, the output signal at the node B2 becomes a low level. FIG. 5C illustrates the wave form of the above-described signal. Next, when the level of the input signal IN changes from a high level to a low level, a high level signal flows at the node B1 by the inverting unit 11, and an NMOS transistor 17 is turned off, and the signal at the node B2 becomes a high level after a predetermined delay time by the resistor 15 and the capacitor 16. The signal of the node B2 has a longer low level interval as shown in FIG. 5C.

FIG. 5C illustrates a signal from the first level transition unit A. In the embodiment of the present invention, as shown in FIG. 4, a second level transition unit B is connected in series with the first level transition unit A. However, the second level transition unit B has the same construction as the first level transition unit A except that the conduction type of the MOS transistor which is used for a signal transmission is opposed.

As shown in FIG. 5C, a signal B2 which is varying from a high level to a lower level inputted into the second transition unit B is outputted from the first transition unit A1, and the output signal B3 becomes a low level by the inverting unit 12. At this time, the PMOS transistor 18 is turned on in accordance with the signal B1 inputted thereinto through the gate 18-1. Therefore, the signal B1 is directly transmitted without passing through the first electrode 18-2 and the second electrode 18-3 of the PMOS transistor 18 or the resistor connected between the source and the drain. Therefore, there is no delay time, and the signal B3 becomes a low level. This signal is shown in FIG. 5D. When the signal B2 changes from the low level to the high level, a low level signal at the node B3 is provided by the inverting unit 12. At this time, since the PMOS transistor 18 is turned off, the signal at B3 is delayed by the resistor 15 and the capacitor 16 of the second level transition unit B, so that the signal at the node B4 becomes a high level. The signal at the node B4 has a long interval in which a high level is maintained as shown in FIG. 5E.

The signal having a longer effective pulse width becomes a signal (shown in FIG. 5F) delayed by the delay unit C connected in series with the level transition units A and B. The delay unit C may include inverting units 13 and 14 and a resistor R and a capacitor C.

Therefore, even when a signal inputted has a shorter pulse width, it is possible to maintain a shorter pulse width signal compared to the conventional art.

In FIG. 4, the NMOS and PMOS transistors 17 and 18 of the level transition units A and B may be substituted with another conduction type of the MOS transistor.

In the present invention, an effective pulse width is maintained even when a shorter pulse width signal is inputted. In addition, an accurate timing is implemented based on the level of the signal in the trigger method.

At this time, the above-described construction may be changed dependent on the design criteria for the circuit.

The duty ratio control circuit adapting a level transition unit according to the present invention capable of controlling an effective pulse width for implementing a predetermined duty ratio (the ratio of an effective pulse interval within one interval) using a circuit will be explained.

Figure 6:
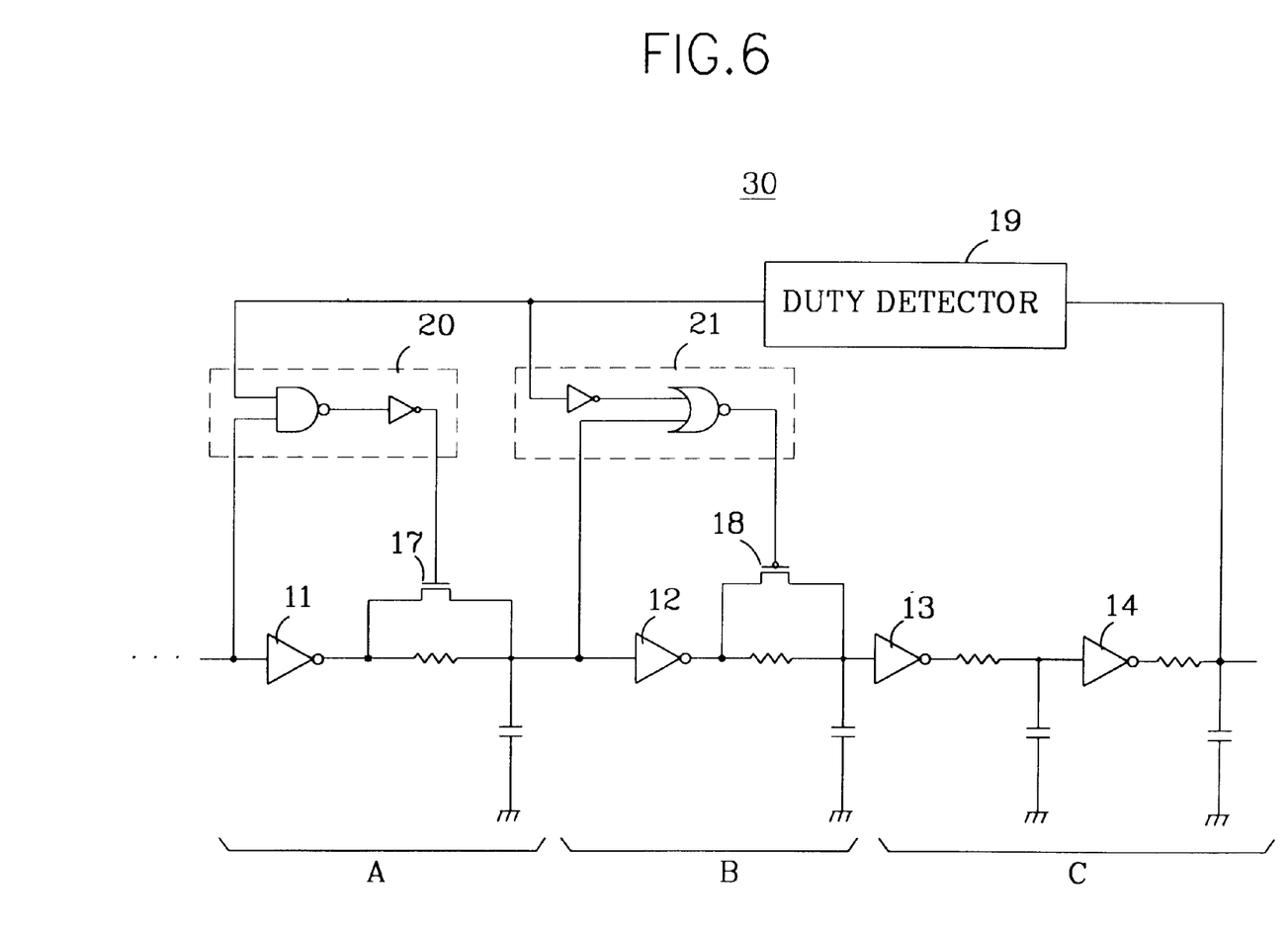
FIG. 6 is a circuit diagram illustrating the construction of a delay circuit having a duty ratio control function according to the present invention.

For convenience and to avoid repetition, the same reference numerals are used in FIG. 6 to represent the same element as in the earlier described embodiment of FIG. 4.

The delay circuit 30 having a duty ratio controlling function is capable of control the duty ratio in accordance with a signal state when controlling an effective pulse width during a delay circuit operation. The above-described operation is implemented by determining an activation of a level transition unit according to the present invention in response to a high or low level signal generated by the duty ratio detector 19 for detecting whether the duty ratio is greater than for example 50% or not after the duty ratio of the final output signal of the circuit is detected.

The circuit according to the present invention includes a first level transition unit A, a second level transition unit B and a delay unit C. In addition, there are further provided a duty detector 19 for detecting a duty ratio of an output signal from the delay unit C and outputting a low level logic signal concerning whether the detected duty ration is larger than a reference duty ratio, and logic circuits 20 and 21 for activating first or second level transition units in accordance with a logic combination between a logic signal from the duty detector 19 and input signals to inverters 11 and 12, respectively.

When fixing the duty ration at 50%, the duty detector 19 outputs a low level signal when the duty ratio is larger than 50% and outputs a high level signal when the duty ratio is smaller than 50% based on a comparison between an effective pulse width of a final output signal from the delay unit and one entire pulse interval. If the duty ratio of the outputted signal is smaller than 50%, a high level signal is outputted and then is applied to the first logic circuit 20. When an input signal changes from a low level to a high level, the first logic circuit 20 which is configured to provide an AND logic function between two signals activates the NMOS transistor 17 of the first level transition unit A. Therefore, an effective pulse width signal which is extended is outputted by the first level transition unit A. In addition, since the second level transition unit B includes a delay circuit, a delayed signal having an effective pulse width may be outputted based on a predetermined delayed time by the circuits which are indicated by the reference characters B and C. At this time, if the effective pulse width is larger than 50%, the duty detector 19 outputs a low level signal. Therefore, the second level transition unit B is activated by the second logic circuit 21. Namely, the second level transition unit B is activated so that a low level signal has an extended delay time for thereby maintaining a 50% duty ratio.

The duty detector may be configured based on a comparison between signal pulse intervals. Preferably, it may be configured in a well known manner.

The circuit according to the present invention is directed to controlling an effective pulse based on a simple construction. The signals are outputted with a predetermined delay time without any loss for a high speed operation. In addition, it is possible to reduce the area of the layout.

As described above, in the present invention, the level transition unit is capable of reducing the area of a layout by properly combining the delay circuit.

As a DRAM has become highly-integrated, and a high speed operation of a semiconductor apparatus is implemented, the delay circuit is seemed to be an important element for eliminating a skew phenomenon between clock signals and enabling an accurate timing. In the present invention, an input signal is applied to a predetermined destination without an error, and the circuit is capable of accurately controlling an active pulse width.

Although the preferred embodiment of the present invention have been disclosed for illustrative purposes, those skilled in the art will appreciate that various modifications, additions and substitutions are possible, without departing from the scope and spirit of the invention as recited in the accompanying claims.

What is claimed is:

1. A delay circuit, comprising:
   first level transition means for receiving an input signal having different logic levels and varying the pulse width of the input signal;
   second level transition means connected with the first level transition means for varying a pulse width of a signal output from the first level transition means; and
   a delay unit which delays an output signal from the second level transition means,
   said first and second level transition means including:
   an inverting means for inverting a signal input the inverting means;
   a MOS transistor having its gate electrode receiving the signal input to the inverting means and its first and second electrodes receiving an output signal from the inverting means;
   a resistor connected between the first electrode and the second electrode; and
   a capacitor connected between the second electrode and a ground.

2. The circuit of claim 1, wherein said MOS transistor of first level transition means is an NMOS transistor.

3. The circuit of claim 1, further comprising a duty ratio detection means connected with the delay unit for activating or non-activating the first and second level transition means in response to an output signal from the delay unit in accordance with a duty ratio preset by an output signal from the delay unit.

4. The circuit of claim 3, wherein said activation and non-activation of the level transition mean are implemented by a signal outputted from the logic combination circuit which logically combines a signal inputted into the level transition means and an output signal from the duty ratio detection means.

5. The circuit of claim 1, wherein conductive types of the MOS transistors of said each level transition means are different.

6. A delay circuit, comprising:
   a first level transition means for receiving an input signal having two different logic levels and varying the pulse width of the same;
   a second level transition means connected with the first level transition means for varying a pulse width of a signal output from the first level transition means;
   a delay unit for delaying an output signal from the second level transition means;
   a duty detection means for generating a duty detection signal from a signal output by the delay unit, the duty detection means having a logic combining circuit for logically combining input signals to the first and second level transition means and the duty detection signal as respective output signals for activating and non-activating the first and second level transition means, each of the first and second level transition means includes:
      an inverting means for inverting a signal input to the inverting means;
      a MOS transistor having a gate electrode for receiving the sign input to the inverting means and its first and second electrodes for receiving an output signal from the inverting means;
      a resistor connected between the first electrode and the second electrode; and
      a capacitor connected between the second electrode and a ground.

7. The circuit of claim 6, wherein said MOS transistor of the first level transition means is an NMOS transistor.

8. The circuit of claim 6, wherein conductive types of the MOS transistors of said each level transition means are different.

9. A delay circuit, comprising:
   a first level transition means for receiving an input signal having two different logic levels and varying a pulse width of the input signal;
   a second level transition means connected with the first level transition mean for varying a pulse width of a signal output from the first level transition means;
   a delay unit for delaying an output signal from the second level transition means;
   a duty detection means for detecting a duty ratio from a signal outputted by the delay unit and outputting a logic signal based on a comparison between the detected duty ratio and a reference duty ratio; and
   a logic circuit for outputting signals for activating the first or second level transition means by logically combining signals input to the first and second level transition means and the logic signal from the duty detection means.

10. The circuit of claim 9 wherein each of the first and second level transition means includes:
    an inverting means for inverting a signal input to the inverting means;
    a MOS transistor having a gate electrode for receiving an output signal from the logic circuit and its first and second electrodes for receiving an output signal from the inverting means;
    a resistor connected between the first electrode and the second electrode; and
    a capacitor connected between the second electrode and a ground.

11. The circuit of claim 10, wherein said MOS transistors of the first and second level transition means are of different conductive types.

12. The circuit of claim 9, wherein said logic circuit includes:
    a first logic unit for activating the first level transition means by logically combining an input signal to the first level transition means and the logic signal from the duty detection means; and
    a second logic unit for activating the second level transition means by logically combining a signal input to the second level transition means and the logic signal from the duty detection means.

13. The circuit of claim 9, wherein said first level transition means is activated when the detected duty ratio is smaller than the reference duty ratio, and said second level transition means is activated when the detected duty ratio is larger than the reference duty ratio.

14. The circuit of claim 13, wherein said reference duty ratio is 50%.

15. A delay circuit, comprising:
    a first level transition means for receiving an input signal having two different logic levels and varying a pulse width of the input signal;
    a second level transition means connected with the first level transition means for varying a pulse width of a signal output from the first level transition means;
    a delay unit for delaying an output signal from the second level transition means;
    a duty detection means for detecting a duty ratio from a signal outputted by the delay unit and outputting a logic signal based on a comparison between the detected duty ratio and a reference duty ratio; and
    a logic circuit for outputting signals for activating the first and second level transition means, said logic circuit including:
    a first logic gate for NANDing an input signal of the first level transition means and the logic signal from the duty detection means;
    a first inverter for inverting an output of the first logic gate and outputting it to the first level transition means;
    a second inverter for inverting the logic signal of the duty detection means; and
    a second logic gate for NORing an output signal of the first level transition means and an output signal of the second inverter, and outputting a NOR results to the second level transition means.

16. The circuit of claim 15, wherein each of the first and second level transition means includes:
    an inverting means for inverting a signal input to the the inverting means;
    a MOS transistor having a gate electrode for receiving an output signal from the logic circuit and first and second electrodes for receiving an output signal from the inverting means;

a resistor connected between the first electrode and the second electrode; and a capacitor connected between the second electrode and a ground.

17. The circuit of claim 16, wherein said MOS transistors of the first and second level transition means are of different conductive types.

18. The circuit of claim 15, wherein said first level transition means is activated when the detected duty ratio is smaller than the reference duty ratio, and said second level transition means is activated when the detected duty ratio is larger than the reference duty ratio.

* * * * *

UNITED STATES PATENT AND TRADEMARK OFFICE
CERTIFICATE OF CORRECTION

PATENT NO. : 6,147,536
DATED : November 14, 2000
INVENTOR(S) : Jeong

It is certified that error appears in the above-identified patent and that said Letters Patent is hereby corrected as shown below:

Title page item,

[73] Assignee: Hyundai Electronics Industries Co. --, Ltd.--

Signed and Sealed this

Twenty-second Day of May, 2001

Attest:

NICHOLAS P. GODICI

Attesting Officer     Acting Director of the United States Patent and Trademark Office